United States Patent
Codrington et al.

[11] Patent Number: 5,166,621
[45] Date of Patent: Nov. 24, 1992

[54] MULTI-RESONANT NMR COILS

[75] Inventors: Robert S. Codrington, Los Altos Hills; Alan R. Rath, Fremont, both of Calif.

[73] Assignee: Spectroscopy Imaging Systems Corporation, Palo Alto, Calif.

[21] Appl. No.: 603,966

[22] Filed: Oct. 26, 1990

[51] Int. Cl.[5] .......................................... G01R 33/20
[52] U.S. Cl. ................... 324/322; 333/175; 333/168; 334/41
[58] Field of Search ............. 324/318, 322, 311, 313; 128/653.5; 333/175, 168; 334/64, 41

[56] References Cited

U.S. PATENT DOCUMENTS

| | | | |
|---|---|---|---|
| 3,098,208 | 7/1963 | Winfield et al. | 334/64 |
| 3,434,043 | 3/1969 | Nelson | 324/5 |
| 4,742,304 | 5/1988 | Schnall et al. | 324/322 |
| 4,788,503 | 11/1988 | Van Heelsbergen | 324/322 |
| 4,833,412 | 5/1989 | Zens | 324/322 |
| 4,890,063 | 12/1989 | Haragashira | 324/322 |
| 4,916,418 | 4/1990 | Rath | 333/219 |
| 4,952,879 | 8/1990 | Van Vaals et al. | 324/322 |
| 5,038,105 | 8/1991 | Codrington | 324/318 |
| 5,041,790 | 8/1991 | Tropp et al. | 324/322 |
| 5,057,778 | 10/1991 | Rath | 324/300 |

OTHER PUBLICATIONS

Alderman, Donald W. and David M. Grant. "An Efficient Decoupler Coil Design which Reduces Heating in Conductive Samples in Superconducting Spectrometers," *Journal of Magnetic Resonance* 36, pp. 447-451 (1979).

Stoll, M. E. et al. "Simple Single-Coil Double Resonance NMR Probe for Solid State Studies," *Rev. Sci. Instrum.* vol. 48, No. 7 Jul. 1977, pp. 801-803.

Cook, Bruce. "A Large Inductance, High-Frequency, High-Q Series-Tuned Coil for NMR," *Journal of Magnetic Resonance* 49, pp. 346-349 (1982).

*Primary Examiner*—Michael J. Tokar
*Assistant Examiner*—Raymond Y. Mah
*Attorney, Agent, or Firm*—Edward H. Berkowitz

[57] ABSTRACT

A saddle coil for multiple tuned response is realized by a segmented sequence of first LC elements each tuned to exhibit a low impedance at $\omega_1$ and a second set of LC elements, each tuned to exhibit a low impedance at $\omega_2$, at least some of said first set of LC elements having one of said second LC elements in parallel therewith.

2 Claims, 5 Drawing Sheets

MULTI-RESONANT NMR COILS

FIELD OF THE INVENTION

The invention is in the area of NMR probe circuits and particularly such probe circuits exhibiting multiple-tuned response.

BACKGROUND OF THE INVENTION

In the area of nuclear magnetic resonance, the need for apparatus equally sensitive to non-adjacent spectral regions is encountered in several contexts. One common example occurs where a sample is irradiated at some (high) frequency for one purpose while the same sample is concurrently irradiated at another (low) frequency for some other purpose. This is typical of a decoupling experiment wherein, for example, $C^{13}$-hydrogen couplings are disturbed while separately exciting the carbon 13 resonance concurrently.

One variation of such a double-tuned arrangement is the need for excitation and observation of chemically distinct samples where one such sample is a control employed for instrumental purposes such as the establishment of a field frequency lock, while the second sample is under study. One example of this arrangement is to be found in U.S. Pat. No. 3,434,043, commonly assigned. Another similar circumstance is the desire to concurrently excite selected different nuclei for acquisition of corresponding spectral response.

A double-tuned circuit often utilizes a single inductor common to two resonant circuits. Each sub-circuit in such an arrangement is separately tuned and impedance matched to its respective rf source (or sink). In one class of double-tuned arrangement, it is necessary for an isolation element to be inserted between high frequency and low frequency sub-circuits, if it is required to achieve *concurrent* excitation at the respective frequencies. If it is sufficient to apply rf energy at different frequencies non-concurrently, there need be no isolation element. This is often the case where separate observations are to be made and it is desirable to avoid a re-tuning procedure or disturbance of the subject/sample. Moreover, the necessity for plural, isolated ports may be less for resonance observation than for resonance excitation. This is the case where, for example, two resonances of substantially different magnitude, a single port matched to the weaker resonance will attenuate the stronger resonance. If such attenuation of one resonance is not desired, it may be preferable to have the benefit of multiple, isolated ports.

Double-tuned circuits are known which employ a transmission line of length $\lambda/4$ (at the high frequency) to provide such isolation. For an example of such an arrangement, see Stoll, Vega, and Vaughan, Rev. Sci. Inst., v. 48, pp. 800–803 (1977).

A combination of $\frac{1}{2}\lambda$ transmission lines has been used to provide a double-tuned arrangement for frequencies in a ratio of a power of two to form a series arrangement of separate inductors at one frequency and a parallel arrangement of the same inductors at another frequency. This work is discussed in U.S. Pat. No. 5,038,105, commonly assigned.

Inductive elements in rf probe circuits are known to include "split inductors" such as taught in the work of Alderman and Grant, J. Mag. Res., v. 36, pp. 447–451 (1979) and Cook and Lowe, J. Mag. Res., v. 49, p. 346 (1982).

Balanced circuits exhibiting electrical symmetry are also known for the purpose of supporting double-tuned apparatus. Such circuits exhibit, among other properties, the virtue that a symmetry plane (or other surface) is defined which has a property of electrical neutrality, which is to say, a virtual ground.

An example of a balanced double-tuned circuit with split inductors and capacitances for NMR observe coils is to be found in U.S. Pat. No. 4,833,412. A double-tuned balanced circuit using lumped elements for a birdcage geometry is described in U.S. Pat. No. 4,916,418 commonly assigned herewith. Yet another double tuned coil, well suited to localized spectral distributions and imaging is described in U.S. Pat. No. 5,057,778, commonly assigned herewith.

The present invention describes a saddle coil exhibiting multiple resonant behavior. Saddle coils define a sample volume of generally cylindrical symmetry and impose a radially directed magnetic field on that sample volume.

DETAILED DESCRIPTION OF THE INVENTION

Figure 1:
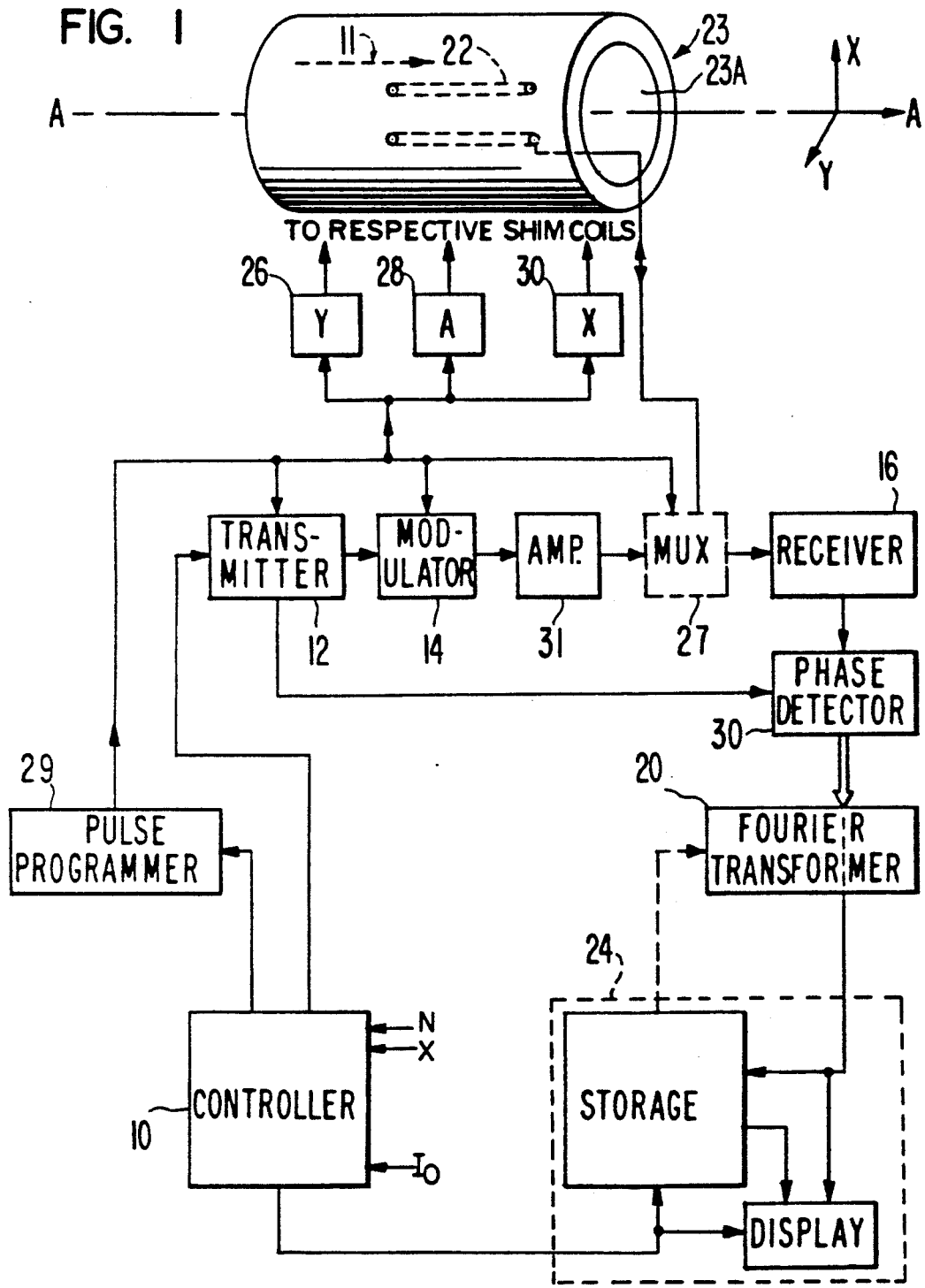
FIG. 1 shows the general context of a system embodying this invention.

Portions of a typical NMR data acquisition instrument are schematically illustrated on FIG. 1. An acquisition/control processor 10 communicates with an rf transmitter 12, modulator 14 and receiver 16, including analog-to-digital converter (not shown) and a fourier transformer 20. The modulated rf power irradiates an object (not shown) in a magnetic field 11 through a probe assembly 22 and the response of the object is intercepted by probe 22 communicating with receiver 16. The response typically takes the form of a transient oscillatory signal, or free induction decay. This transient waveform is sampled at regular intervals and samples are digitized in ADC 18. The digitized time domain waveform is then subject to further processing in processor 20. The nature of such processing may include averaging a time domain waveform with a number of nominally identical such waveforms, and transformation of the average time domain waveform to the frequency domain yields a spectral distribution function directed to output device 24. The latter may take on any of a number of identities for the display of further data and analysis.

The magnetic field 11 which polarizes a sample is established by an appropriate means indicated in FIG. 1 such as cryostat 23 for the establishment and maintenance of a superconducting phase in a saddle coil, not shown. The cryostat comprises a bore 23A in which the probe and sample are housed at room temperature.

Figure 2:
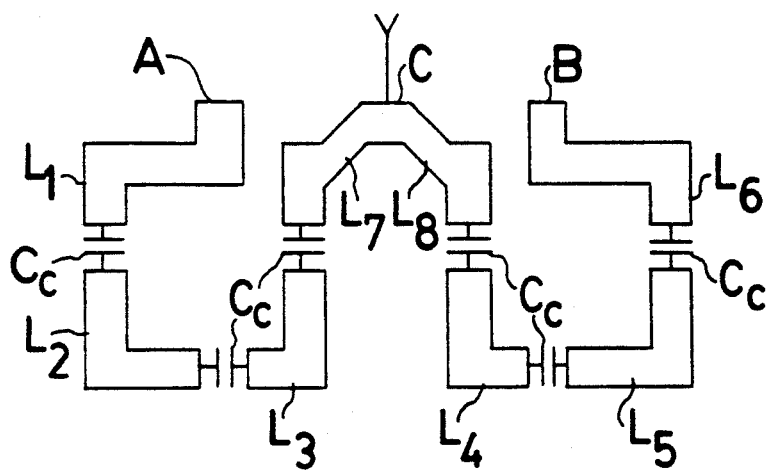
FIG. 2 shows a saddle coil of prior art mapped onto a plane.
Figure 3A:
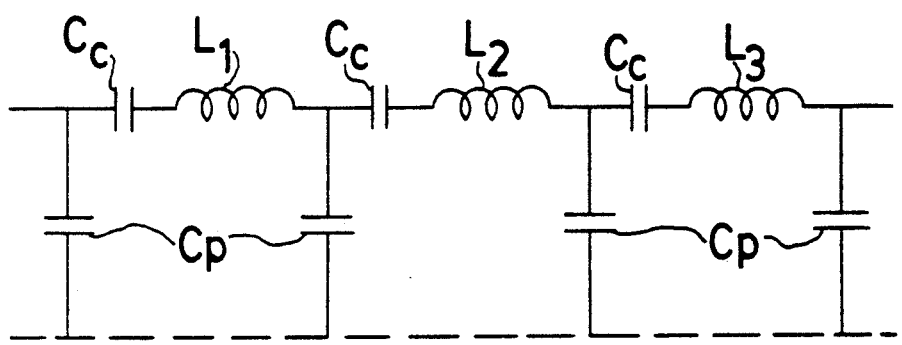
FIG. 3A is the effective circuit of the saddle coil of FIG. 2.

Turning now to FIG. 2, there is shown a saddle coil of prior art, unrolled or mapped onto plane. In typical usage, this arrangement is disposed on the wall of a cylinder whereby points A and B coincide and the rf source is applied at point C. The saddle coil is often disposed within a unipotential outer cylindrical conductor (shield). The equivalent circuit is shown in either of FIGS. 3a or 3b where $C_p$ is the effective capacitance to the shield.

Figure 3B:
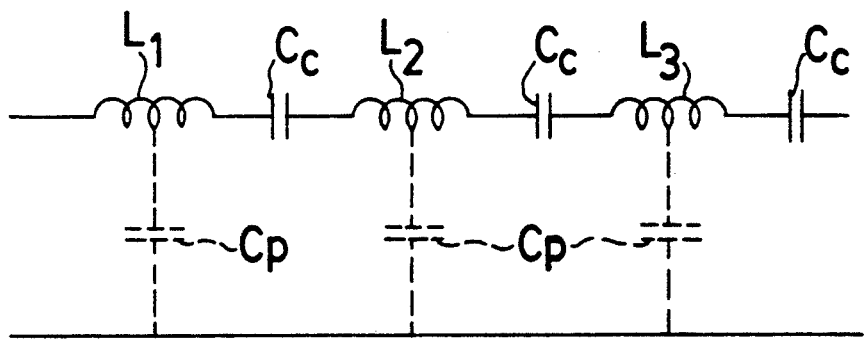
FIG. 3B is an effective circuit of the present invention.
Figures 4A, 4B, 4C:
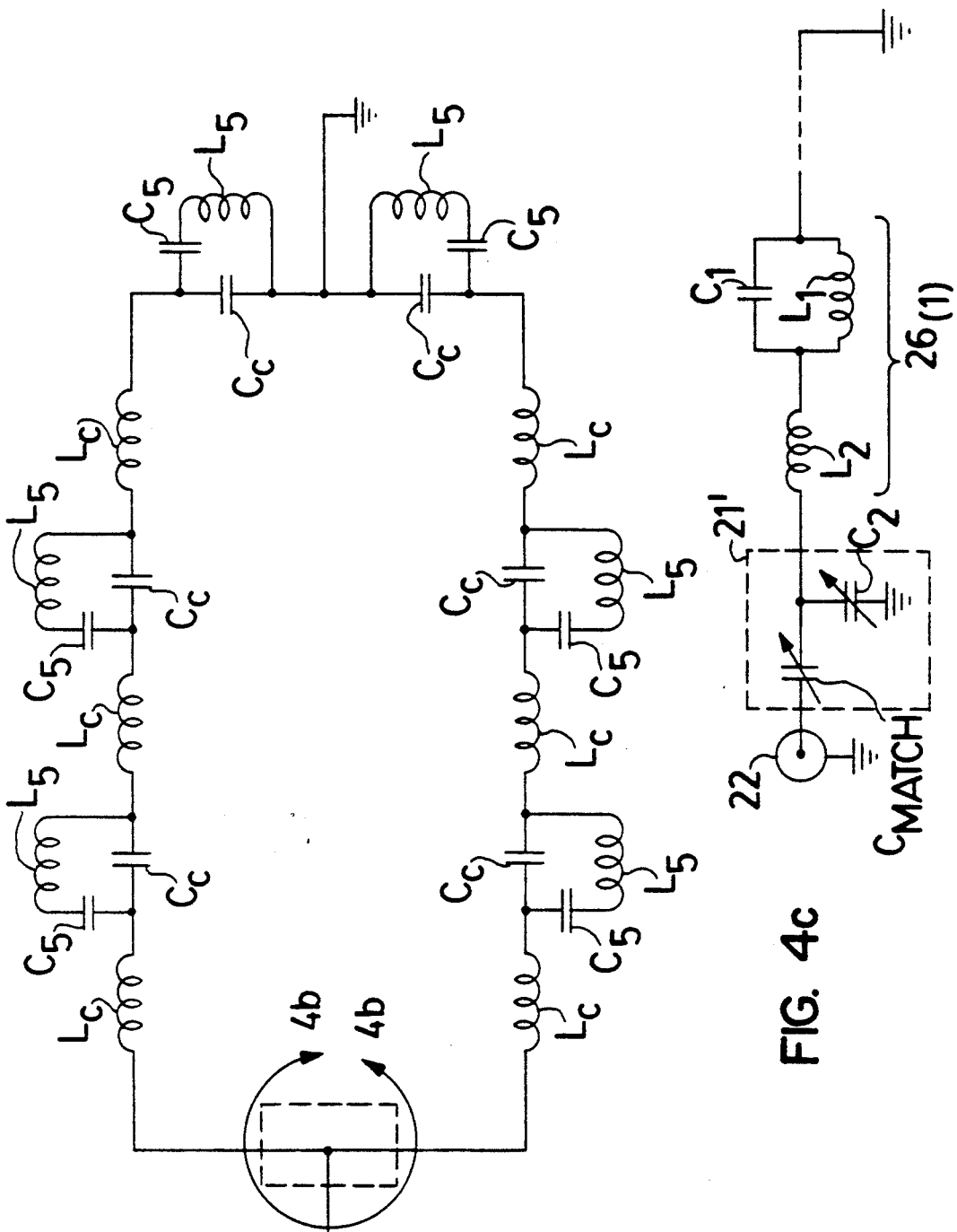
FIG. 4A is an example of the present invention.
FIG. 4B in an optional dual port modification for the circuit of FIG. 4A.
FIG. 4C is a simplification of FIG. 4A.

In the present invention, the effective circuit in FIG. 3b, for example, is modified by shunting each series capacitor $C_c$ with an inductor $L_s$ where the impedance presented by $L_s$ is much greater than the impedance of $C_c$ at the high frequency, and the impedance of $L_c$ is much less than the impedance presented by $C_c$ at the lower frequency. The addition of series capacitor $C_s$ provides the ability to tune to a desired series resonant condition. A three section example of the present invention following this embodiment is shown in FIG. 4A. A tune and match capacitor combination 21 may be employed to tune the coil to a relatively low frequency because the impedance of the $C_s$-$L_s$ combination effectively shorts out $C_c$ at the low frequency resonance.

In FIG. 4B there is shown an example of slight modification to the saddle coil of FIG. 4A to present a balanced pair of rf isolated ports for concurrent excitation. In principle, the tune and match combination 21 is eliminated (or further simplified) because each port is carefully matched to its external source/sink.

FIG. 4C is a simplification of the circuit of FIG. 4A. The subcircuit 26 is repeated a desired number of times N in series, e.g., $26_1$, $26_2$, $26_3$, ... $26_N$. A resonant condition generally obtains for a resonant frequency $\omega$.

$$\omega^2 = \cfrac{1}{NC_2\left[L_1 + \cfrac{L_2}{1 - \omega^2 L_2 C_1}\right]} \quad (1)$$

This relation may be separately stated for two distinct frequencies $\omega_1$ and $\omega_2$ for the common parameter $C_1$. The two equations in $C_1$ can be written in the form $$C_1^2[\omega_1^2\omega_2^4 L_1 L_2^2 - \omega_1^4\omega^2 L_1 L_2^2] + \quad (2)$$

$$C_1[\omega_1^4 L_1 L_2 - \omega_2^4 L_1 L_2] + \omega_2^2(L_1 + L_2) - \omega_1^2(L_1 + L_2)] = 0$$

which is independent of the external tuning capacitance $C_2$ and the number of stages, N. The solution for $C_1$ has two roots for the double resonance condition. However, the choice of which of the two roots to select may depend upon other considerations as discussed below.

In another embodiment of the invention, the multiplicity of circuit resonances can be expanded beyond double-tuned response by adding series resonant combinations in parallel with corresponding sections.

Figure 5:
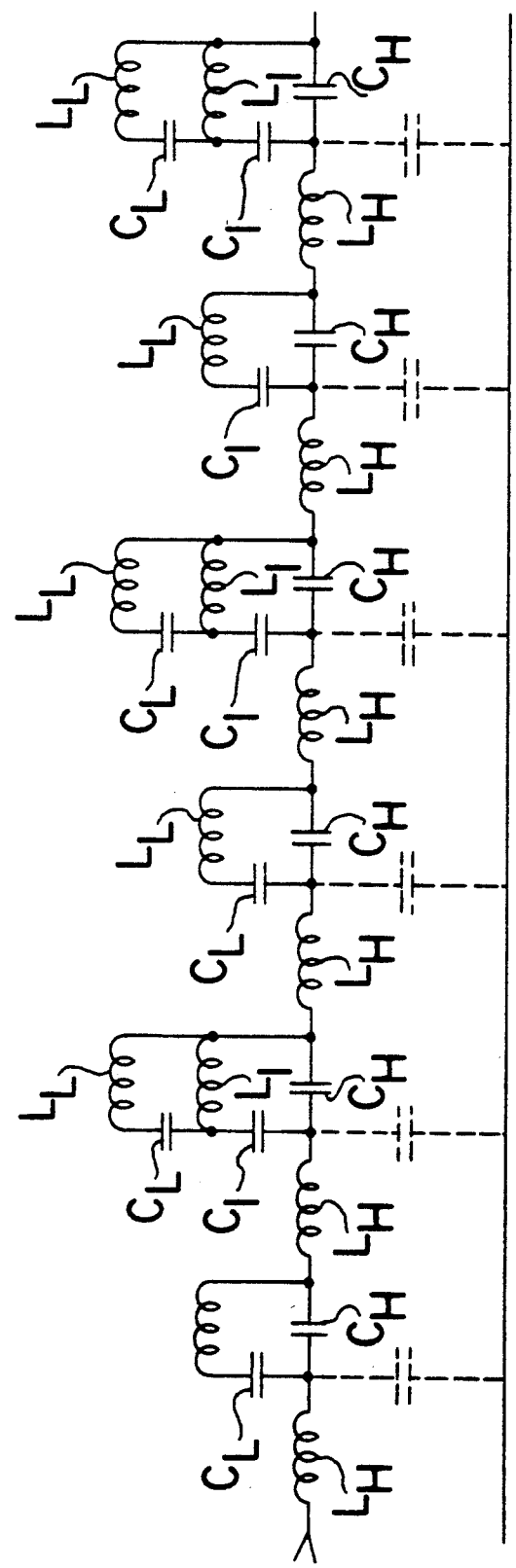
FIG. 5 is a triple resonant circuit of the present invention.

Consider a saddle coil capable of resonant response to three different frequencies without adjustment. A portion of this effective circuit is shown in FIG. 5 for high, intermediate and low frequencies $\omega_H$, $\omega_I$, and $\omega_L$. Series resonant combinations $L_H$-$C_H$ comprise the high frequency resonant network. The $L_L$ shunt introduces singularities in the impedance of the circuit at $\omega_I$ and $\omega_L$ as well as the singularity due to the $L_H$-$C_H$ combination. In this example, alternate $L_H$-$C_H$ sections are paralleled by an intermediate frequency shunt $L_I$-$C_I$ with the result that the inductive portions of this saddle coil are twice as long for frequencies other than the resonant frequencies than is the case for the single resonant case. At $\omega_2$ all capacitances, $C_H$ are shunted by the $C_L$-$L_L$ section and the total inductance is the sum of the individual $L_H$ sections. (FIG. 5 represents a portion of closed loop arrangement as shown in FIG. 4A.)

Figure 4D:
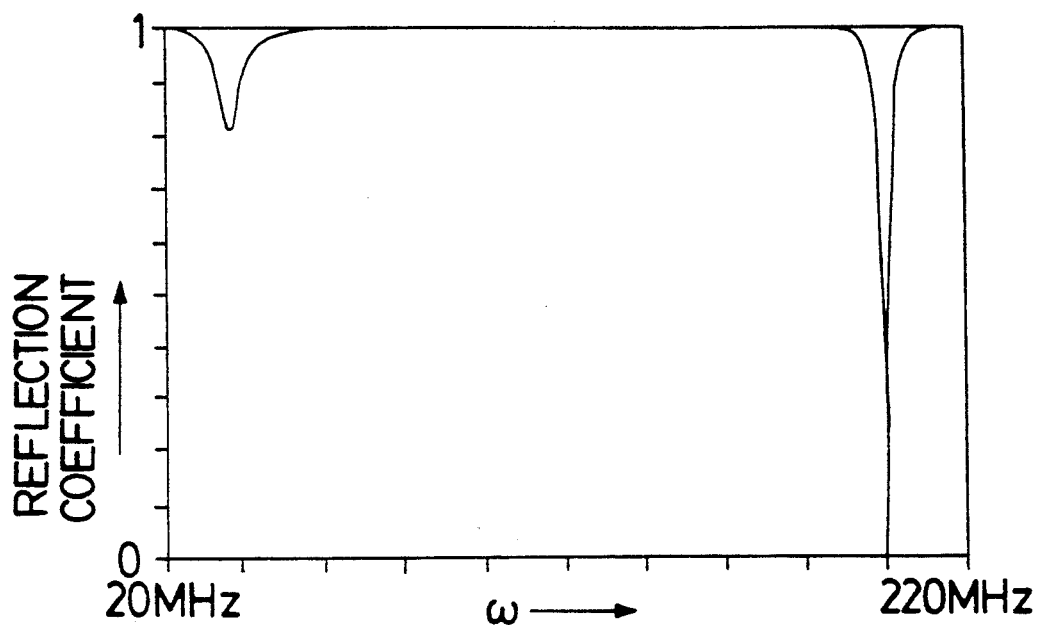
FIGS. 4D and 4E show the frequency response of the FIG. 4C circuit.
Figure 4E:
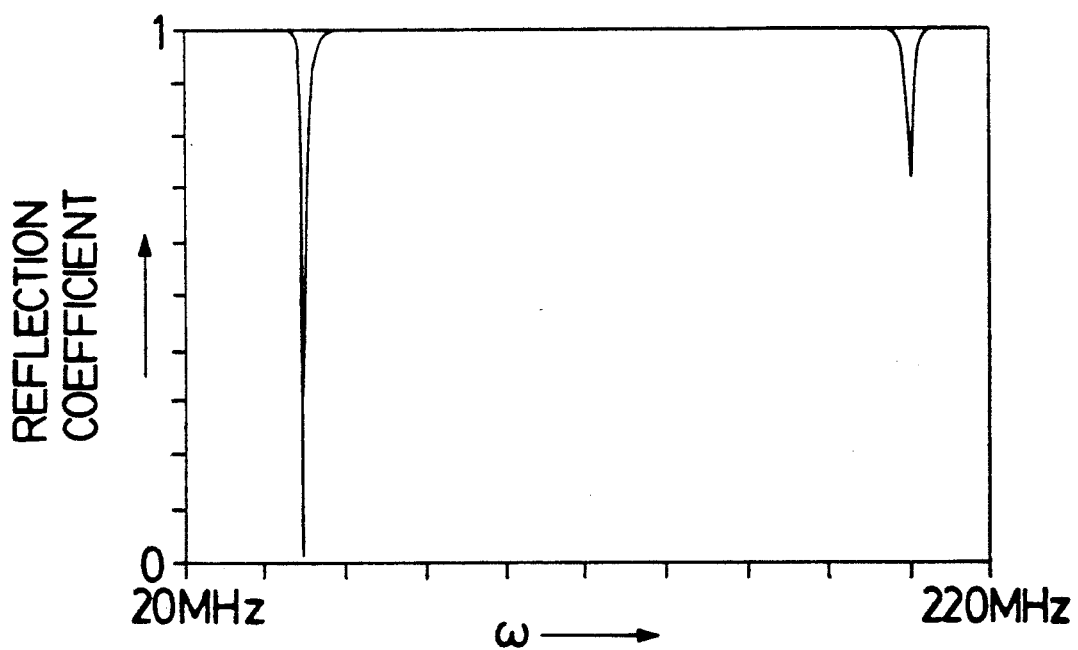

Consider an example wherein it is desired to obtain resonant behavior from a circuit of the type shown FIG. 4C. A single section (subcircuit 26) of that circuit is shown in FIG. 4C. The capacitor array 21' performs a tune and match function for the rf source presented at the input 22. It is desired to obtain resonant response at 200 MHz and at 50 MHz (successively applied to input 22) with one free parameter, e.g., $C_{match}$. Accordingly, a solution is obtained for $L_1 = 30$ nH; $L_2 = 100$ nH (with $Q = 100$); $C_1 = 27.82$ pf; and, $C_2 = 14.90$. FIG. 4D and 4E show the response (reflection co-efficient) of the saddle coil section of FIG. 4C with these values. The 200 MHz singularity is quite stable. The low frequency resonance is accurately achieved at 50 MHz with a value of $C_{match} = 4.20$ pf and wanders to $\sim 35$ MHz for $C_{match} = 24.0$ pf.

The efficiency of the circuit of FIG. 4C has been investigated by comparing the power required for a 90° pulse at 81 and at 200 MHz with the power required at the respective frequencies for achieving a 90° pulse in a single tuned coil closely coupled to the sample.

The relative efficiency is established from a comparison of the current through the double resonant subcircuit 26 of FIG. 4C compared with a simple model single resonance series LC circuit (obtained by removing $L_2$). The power $P_d$ for the double resonant loop 26 and the power $P_s$ for the single resonant model is respectively at resonance, $$P_d = (I_1)^2 R_{L1} + (I_L)^2 R_{L2} \quad (3a)$$

$$P_s = (I_1)^2 R_{L1} \quad (3b)$$

where the values R are the real part of the complex impedances for the subscripted components. The impedance in the $L_2$ $C_1$ loop is given by $$\frac{Z_{L2} Z_c}{Z_{L2} + Z_c}$$

The current through the inductance $L_2$ is then given by $$I_{L2} = \frac{I_1 Z_c}{Z_{L2} + Z_c} \quad (4)$$

Substituting the above into Eq 3a and 3b and dividing by the single resonant mode current $I_s = [P_s/R_{L1}]^{\frac{1}{2}}$ there obtains the result $$\frac{I_d}{I_s} = R_{L1}^{1/2} \{R_{L1} + (R_{L2} Z_c^2)/(Z_{L2} + Z_c)^2\}^{-1/2}$$

The real part of the inductive reactances $R_{L1}$ and $R_{L2}$ may be rewritten, taking account of the Q values of the inductances as $L_1/Q_1$ and $L_2/Q_2$ respectively to obtain the relative efficiency of the double resonant subcircuit 26 with respect to the model single resonant circuit $$\epsilon_d/\epsilon_2 = \frac{L_1}{\sqrt{L_1 + \frac{Q_1 L_2}{Q_2[\omega^2 L_2 C - 1]^2}}}$$

For the case $L_1 = 100$ nH, $L_2 = 50$ nH and resonant frequencies 81 MHz and 200 MHz, the capacity $C_1$ may have either one of two values (associated with the two roots for the double tuned resonance) indicated below with the corresponding relative efficiency. For the purposes of a simple comparison, it is assumed that the inductances exhibit identical Q values. The results are enumerated below:

| $C_1$ | 81 MHz | 200 MHz |
| --- | --- | --- |
| 61.45 | 15.9% | 98.7% |
| 21.43 | 71.5% | 69.9% |

It is evident that a choice of $C_1$ as in the above example can be exploited to emphasize, or de-emphasize, the relative response in respective resonant channels.

The multiple resonant behavior discussed herein in the context of excitation of rf resonances from distinct radio frequencies applied to the input(s) should be understood to include similar multiple resonant responses for inductive coupling to the coil of rf energy radiated from a nuclear resonant sample following such excitation.

The above invention has been described as referenced to particular embodiments and examples. However, other modifications and variations will occur to those skilled in the art in view of the above teaching. It is to be understood that this invention may be practiced otherwise than as specifically described and is limited only by the scope of the appended claims.

What is claimed is:

1. A circuit resonant at two non-adjacent frequencies $\omega_1$ and $\omega_2$ comprising:
    (a) a plurality of first LC series elements, each said element in series relationship, an initial said LC series element receiving rf power and a final said LC series element connected to ground, said LC series elements each comprising an inductive member of inductance L in series with a capacitive member of capacitance $C_c$,
    (b) shunt means arranged in parallel with each said capacitive member $C_c$, said shunt means comprising a second LC series element, said second LC series element comprising a capacitive element $C_s$ in series relation with an inductive member $L_c$, whereby said first LC series elements present a low impedance to a first selected frequency and a high impedance to a second selected frequency and said second LC series elements present a high impedance to said first frequency and a low impedance to said second frequency.

2. A method for achieving a multiresonant responsive circuit comprising the steps of
    arranging a plurality of first LC elements in series, each said element tuned to exhibit a low impedance at a first selected frequency $\omega_1$ and a relatively high impedance for frequencies other than substantially $\omega_1$
    connecting in parallel with each of selected ones of said plurality of first LC elements a corresponding second LC element, said second LC element exhibiting a low impedance at a selected frequency $\omega_2$ and a relatively high impedance at frequencies other than $\omega_2$, $\omega_2 \neq \omega_1$.

* * * * *